United States Patent
Ripley

(10) Patent No.: US 12,356,859 B2
(45) Date of Patent: Jul. 8, 2025

(54) METHODS AND ASSEMBLIES FOR CHARACTERIZING ULTRASONIC ENVIRONMENTS USING PIEZO-ELECTRIC SENSOR DEVICES

(71) Applicant: Consolidated Nuclear Security, LLC, Oak Ridge, TN (US)

(72) Inventor: Edward Bolling Ripley, Knoxville, TN (US)

(73) Assignee: Consolidated Nuclear Security, LLC, Oak Ride (TN)

( * ) Notice: Subject to any disclaimer, the term of this patent is extended or adjusted under 35 U.S.C. 154(b) by 552 days.

(21) Appl. No.: 17/666,722

(22) Filed: Feb. 8, 2022

(65) Prior Publication Data

US 2023/0255115 A1 Aug. 10, 2023

(51) Int. Cl.
| | |
|---|---|
| *H10N 30/30* | (2023.01) |
| *B08B 3/12* | (2006.01) |
| *B08B 13/00* | (2006.01) |
| *H10N 30/80* | (2023.01) |

(52) U.S. Cl.
CPC ............. *H10N 30/302* (2023.02); *B08B 3/12* (2013.01); *B08B 13/00* (2013.01); *H10N 30/802* (2023.02)

(58) Field of Classification Search
CPC ...... H10N 30/302; H10N 30/802; B08B 3/12; B08B 13/00
USPC .................................................. 73/649, 1.82
See application file for complete search history.

(56) References Cited

U.S. PATENT DOCUMENTS

| | | | | |
|---|---|---|---|---|
| 3,443,797 A | * | 5/1969 | Branson | B08B 3/12 |
| | | | | 73/590 |
| 5,706,840 A | | 1/1998 | Schneider et al. | |
| 2011/0139173 A1 | * | 6/2011 | Akutsu | G01H 3/10 |
| | | | | 134/1 |
| 2020/0298288 A1 | * | 9/2020 | Okada | G01H 11/08 |

FOREIGN PATENT DOCUMENTS

| | | | |
|---|---|---|---|
| JP | 2002310781 A | * | 10/2002 |
| JP | 2003177058 A | * | 6/2003 |
| JP | 2008010732 A | | 1/2008 |

OTHER PUBLICATIONS

Translation of JP 2002310781 (Year: 2002).*
Translation of JP 2003117058 (Year: 2003).*

* cited by examiner

*Primary Examiner* — John E Breene
(74) *Attorney, Agent, or Firm* — Clements Bernard Walker; Christopher L. Bernard

(57) ABSTRACT

Methods and systems for characterizing ultrasonic environments using piezo-electric sensor devices. In general, a piezo-electric sensor assembly is disposed and selectively repositioned in the fluid in an ultrasonic cleaning vessel, before, while, or after a component to be cleaned is present, providing quantitative and directional data regarding the high and low energy areas within the tank, where cleaning will be more or less intense, as well as areas in which standing waves without cavitation are present, representing cleaning dead spots. Further, the presence of harmonic vibrations can be detected where a fixed frequency causes a part itself to resonate. Thus, wave cancellation, reinforcement, and relative uniformity can be mapped and assessed in an ultrasonic environment, such as an ultrasonic cleaning environment or ultrasonic environment used for another purpose.

9 Claims, 8 Drawing Sheets

METHODS AND ASSEMBLIES FOR CHARACTERIZING ULTRASONIC ENVIRONMENTS USING PIEZO-ELECTRIC SENSOR DEVICES

STATEMENT REGARDING GOVERNMENT RIGHTS

The U.S. Government has certain rights to and in the present disclosure pursuant to Contract No. DE-NA0001942 between the U.S. Department of Energy and Consolidated Nuclear Security, LLC.

TECHNICAL FIELD

The present disclosure relates generally to the ultrasonic cleaning and piezo-electric (piezo-resistive) sensor fields. More particularly, the present disclosure relates to methods and systems for characterizing ultrasonic environments using piezo-electric sensor devices.

BACKGROUND

Ultrasonic cleaners utilizing a vessel in which ultrasonic waves are generated in a fluid are used in many applications, such as medical, military, aerospace, etc., to precision clean critical components and equipment disposed in the fluid. Such ultrasonic cleaners are often inconsistent. The ultrasonic fields generated in a vessel are dependent upon vessel geometry, ultrasonic frequency, output power, and vessel loading, and may actually be perturbed by the materials being cleaned themselves. Thus, cleaning results are often not reproducible. Further, the tools that are used to characterize an ultrasonic cleaning environment are typically qualitative and not quantitative, provide only retrospective measurements and do not provide real-time feedback, and reflect only a single area in which they are located.

Conventional tank-type ultrasonic cleaning systems typically use a single-frequency to create ultrasonic cavitation in the fluid. Such systems are prone to tank dead spots due to naturally occurring standing waves. In these dead spots, there is no cavitation and, thus, no cleaning. Further, harmonic vibrations can develop when a fixed frequency causes a part itself to resonate. Sweep cleaning technology solves this problem to some extent, delivering a more thorough and effective ultrasonic cleaning option, but may potentially damage sensitive parts, such as crystals or fine wires. Thus, it is important to be able to characterize and optimize an ultrasonic environment.

When looking at the energy distribution of ultrasonic waves in an ultrasonic cleaning environment, it may be difficult to fully characterize the wave strength in different areas of the tank. Qualitatively, a sheet of aluminum foil or the like can be placed in the tank and observable distortions in the foil will provide an image of cross-sectional energy in the tank. By piecing this type of data together, one can identify high and low energy areas within the tank, but this type of measurement is not quantitative. The use of hydrophones has also been explored, but this method also has severe limitations. Further, various strips and rods with dye or other visual indicators have been used to qualitatively assess the thoroughness and cleaning patterns within an ultrasonic environment, but these are one-time use devices that themselves affect the ultrasonic environment (disturbing the ultrasonic field and potentially contaminating the fluid in the tank) and provide only retrospective insights, not real-time data. Thus, improved methods and systems for characterizing and optimizing an ultrasonic environment are needed.

This background is provided as an illustrative contextual environment only. It will be readily apparent to those of ordinary skill in the art that the methods and systems of the present disclosure may be implemented in other contextual environments equally.

SUMMARY

The present disclosure provides methods and systems for characterizing ultrasonic environments using piezo-electric sensor devices. In general, a piezo-electric sensor assembly is disposed and selectively repositioned in the fluid in an ultrasonic cleaning vessel, before, while, or after a component to be cleaned is present, providing quantitative and directional data regarding the high and low energy areas within the tank, where cleaning will be more or less intense, as well as areas in which standing waves without cavitation are present, representing cleaning dead spots. Further, the presence of harmonic vibrations can be detected where a fixed frequency causes a part itself to resonate. Thus, wave cancellation, reinforcement, and relative uniformity can be mapped and assessed in an ultrasonic environment, such as an ultrasonic cleaning environment or ultrasonic environment used for another purpose (agitation, mixing, etc.). This data can be used to tune the frequencies of the transducers utilized to create a homogenous environment, or an environment with an energy profile specifically designed for a desired application, whether static or dynamic and varying over time. Thus, the ultrasonic cleaning environment can be tuned for gentle to intense cleaning, being less intense in some areas and more intense in other areas to thoroughly clean some portions of a part while not damaging more sensitive portions of the part. This is accomplished by creating interference patterns and reinforcement patterns within the vessel, as determined by the piezo-electric sensor assembly, resulting in decreased and increased intensity regions within the vessel, effectively cleaning sensitive and robust portions of the part simultaneously within the same ultrasonic cleaning environment, for example. This cleaning profile can also be modified and monitored over time using the piezo-electric sensor assembly, thereby providing an effective sweep cleaning equivalent.

In addition to critical component cleaning applications in the medical, military, and aerospace fields and the like, as well as agitation and mixing applications and the like, the piezo-electric sensor assembly and associated methodologies of the present disclosure may be used in medical acoustic wave therapy applications, where a thin, disposable variant of the piezo-electric sensor assembly is used to provide real-time feedback related to the efficacy of a particular treatment. By applying the piezo-electric sensor assembly to the surface of a patient's skin, therapeutic input energies can be determined, as well as reflected and sympathetic wave data, which can be used to tailor a patient treatment plan, document patient treatment, and generate data to improve patient outcome.

In one illustrative embodiment, the present disclosure provides a piezo-electric sensor system adapted to monitor/characterize an ultrasonic environment, the piezo-electric sensor system including: a first piezo-electric material body adapted to generate an output voltage responsive to force applied by an ultrasonic wave in the ultrasonic environment in one or more directions along a first axis; one or more electrical contacts electrically coupled to the first piezo-electric material; and a control system electrically coupled to the one or more electrical contacts and operable for monitoring/characterizing the ultrasonic environment based on the output voltage. Optionally, the piezo-electric sensor system further includes a second piezo-electric material body adapted to generate an output voltage responsive to force applied by an ultrasonic wave in the ultrasonic environment in one or more directions along a second axis orthogonal to the first axis. Optionally, the first piezo-electric material body and the second piezo-electric material body are the same piezo-electric material body adapted to generate output voltages responsive to forces applied by ultrasonic waves in the ultrasonic environment in any of the one or more directions along any of the first axis and the second axis. Optionally, the piezo-electric sensor system further includes a third piezo-electric material body adapted to generate an output voltage responsive to force applied by an ultrasonic wave in the ultrasonic environment in one or more directions along a third axis orthogonal to the first axis and the second axis. Optionally, the first piezo-electric material body, the second piezo-electric material body, and the third piezo-electric material body are the same piezo-electric material body adapted to generate output voltages responsive to forces applied by ultrasonic waves in the ultrasonic environment in any of the one or more directions along any of the first axis, the second axis, and the third axis. Optionally, the first piezo-electric material body is formed as a thin-film body adapted to be disposed on a surface to be exposed to the ultrasonic wave in the ultrasonic environment.

In another illustrative embodiment, the present disclosure provides an ultrasonic system, including: a piezo-electric sensor assembly adapted to measure ultrasonic waves in an ultrasonic environment; an ultrasonic transducer adapted to generate the ultrasonic waves in the ultrasonic environment; and a control system electrically coupled to the piezo-electric sensor assembly and the ultrasonic transducer and operable for monitoring/characterizing the ultrasonic environment based on an output from the piezo-electric sensor assembly and selectively modifying operation of the ultrasonic transducer. The piezo-electric sensor assembly includes a first piezo-electric material body adapted to generate an output voltage responsive to force applied by an ultrasonic wave in the ultrasonic environment in one or more directions along a first axis. Optionally, the piezo-electric sensor assembly further includes a second piezo-electric material body adapted to generate an output voltage responsive to force applied by an ultrasonic wave in the ultrasonic environment in one or more directions along a second axis orthogonal to the first axis. Optionally, the first piezo-electric material body and the second piezo-electric material body are the same piezo-electric material body adapted to generate output voltages responsive to forces applied by ultrasonic waves in the ultrasonic environment in any of the one or more directions along any of the first axis and the second axis. Optionally, the piezo-electric sensor assembly further includes a third piezo-electric material body adapted to generate an output voltage responsive to force applied by an ultrasonic wave in the ultrasonic environment in one or more directions along a third axis orthogonal to the first axis and the second axis. Optionally, the first piezo-electric material body, the second piezo-electric material body, and the third piezo-electric material body are the same piezo-electric material body adapted to generate output voltages responsive to forces applied by ultrasonic waves in the ultrasonic environment in any of the one or more directions along any of the first axis, the second axis, and the third axis. Optionally, the first piezo-electric material body is formed as a thin-film body adapted to be disposed on a surface to be exposed to the ultrasonic wave in the ultrasonic environment.

In a further illustrative embodiment, the present disclosure provides an ultrasonic method, including: positioning a piezo-electric sensor assembly adapted to sense ultrasonic waves at a first position in an ultrasonic environment; and monitoring/characterizing the ultrasonic waves at the first position in the ultrasonic environment based on a first output from the piezo-electric sensor assembly. Optionally, the ultrasonic method further includes modifying operation of an ultrasonic transducer used to generate the ultrasonic waves in the ultrasonic environment based on the first output from the piezo-electric sensor assembly. Optionally, the ultrasonic method further includes: repositioning the piezo-electric sensor assembly adapted to sense ultrasonic waves at a second position in the ultrasonic environment; and monitoring/characterizing the ultrasonic waves at the second position in the ultrasonic environment based on a second output from the piezo-electric sensor assembly. Optionally, the ultrasonic method further includes modifying operation of an ultrasonic transducer used to generate the ultrasonic waves in the ultrasonic environment based on the second output from the piezo-electric sensor assembly. The piezo-electric sensor assembly includes a first piezo-electric material body adapted to generate an output voltage responsive to force applied by an ultrasonic wave in the ultrasonic environment in one or more directions along a first axis. Optionally, the piezo-electric sensor assembly further includes: a second piezo-electric material body adapted to generate an output voltage responsive to force applied by an ultrasonic wave in the ultrasonic environment in one or more directions along a second axis orthogonal to the first axis; and a third piezo-electric material body adapted to generate an output voltage responsive to force applied by an ultrasonic wave in the ultrasonic environment in one or more directions along a third axis orthogonal to the first axis and the second axis. Optionally, the first piezo-electric material body, the second piezo-electric material body, and the third piezo-electric material body are the same piezo-electric material body adapted to generate output voltages responsive to forces applied by ultrasonic waves in the ultrasonic environment in any of the one or more directions along any of the first axis, the second axis, and the third axis.

BRIEF DESCRIPTION OF THE DRAWINGS

The present disclosure is illustrated and described herein with reference to the various drawings, in which like reference numbers are used to denote like assembly components/method steps, as appropriate, and in which.

DETAILED DESCRIPTION

Again, the present disclosure provides methods and systems for characterizing ultrasonic environments using piezo-electric sensor devices. In general, a piezo-electric sensor assembly is disposed and selectively repositioned in the fluid in an ultrasonic cleaning vessel, before, while, or after a component to be cleaned is present, providing quantitative and directional data regarding the high and low energy areas within the tank, where cleaning will be more or less intense, as well as areas in which standing waves without cavitation are present, representing cleaning dead spots. Further, the presence of harmonic vibrations can be detected where a fixed frequency causes a part itself to resonate. Thus, wave cancellation, reinforcement, and relative uniformity can be mapped and assessed in an ultrasonic environment, such as an ultrasonic cleaning environment or ultrasonic environment used for another purpose (agitation, mixing, etc.). This data can be used to tune the frequencies of the transducers utilized to create a homogenous environment, or an environment with an energy profile specifically designed for a desired application, whether static or dynamic and varying over time. Thus, the ultrasonic cleaning environment can be tuned for gentle to intense cleaning, being less intense in some areas and more intense in other areas to thoroughly clean some portions of a part while not damaging more sensitive portions of the part. This is accomplished by creating interference patterns and reinforcement patterns within the vessel, as determined by the piezo-electric sensor assembly, resulting in decreased and increased intensity regions within the vessel, effectively cleaning sensitive and robust portions of the part simultaneously within the same ultrasonic cleaning environment, for example. This cleaning profile can also be modified and monitored over time using the piezo-electric sensor assembly, thereby providing an effective sweep cleaning equivalent.

In addition to critical component cleaning applications in the medical, military, and aerospace fields and the like, as well as agitation and mixing applications and the like, the piezo-electric sensor assembly and associated methodologies of the present disclosure may be used in medical acoustic wave therapy applications, where a thin, disposable variant of the piezo-electric sensor assembly is used to provide real-time feedback related to the efficacy of a particular treatment. By applying the piezo-electric sensor assembly to the surface of a patient's skin, therapeutic input energies can be determined, as well as reflected and sympathetic wave data, which can be used to tailor a patient treatment plan, document patient treatment, and generate data to improve patient outcome.

Figure 1:
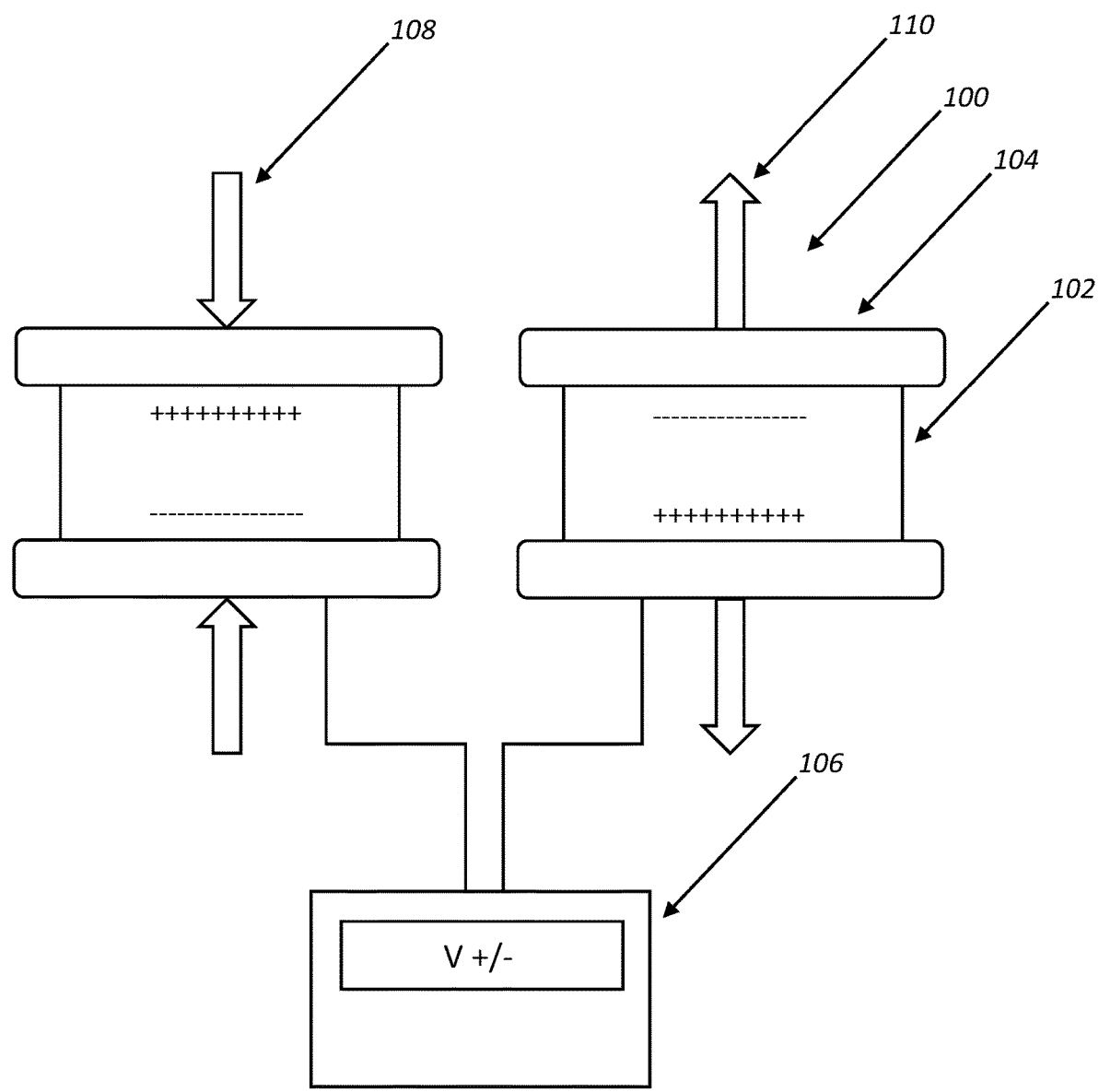
FIG. 1 is a schematic diagram illustrating the general principle of operation of one embodiment of the piezo-electric sensor of the present disclosure.

FIG. 1 is a schematic diagram illustrating the general principle of operation of one embodiment of the piezo-electric sensor 100 of the present disclosure. The sensor 100 includes a piezo-electric material 102, such as a quartz crystal or the like, that is coupled to a pair of electrical contacts 104. The piezo-electric material 100 generates a voltage that is sensed via a voltmeter 106 or the like when a compressive force 108 or a tensile force 110 is applied, such as by an ultrasonic wave or the like. The magnitude of the output voltage is directly proportional to the applied force. The polarity of the output voltage is dependent on the direction of the applied force. Thus, the polarity of the output voltage for a compressive force is opposite the polarity of the output voltage for a tensile force. Here, a one-axis sensor 100 is illustrated. Such sensors 100 can be very small, such that sampling may be performed without unduly affecting the sampled ultrasonic environment. The sensors 100 may be provided as a probe, a thin film, etc., depending on the application. By measuring force over time, wave frequency may be determined, and by making repeated repositioned measurements, a force or frequency map of a sampled area can be generated, as can ultrasonic wave profile over time. Although quartz is mentioned herein, other non-limiting illustrative piezo-electric materials include Berlinite (which is structurally identical to quartz), topaz, tourmaline, apatite, barium titanate, and lead zirconate titanate.

Figure 2:
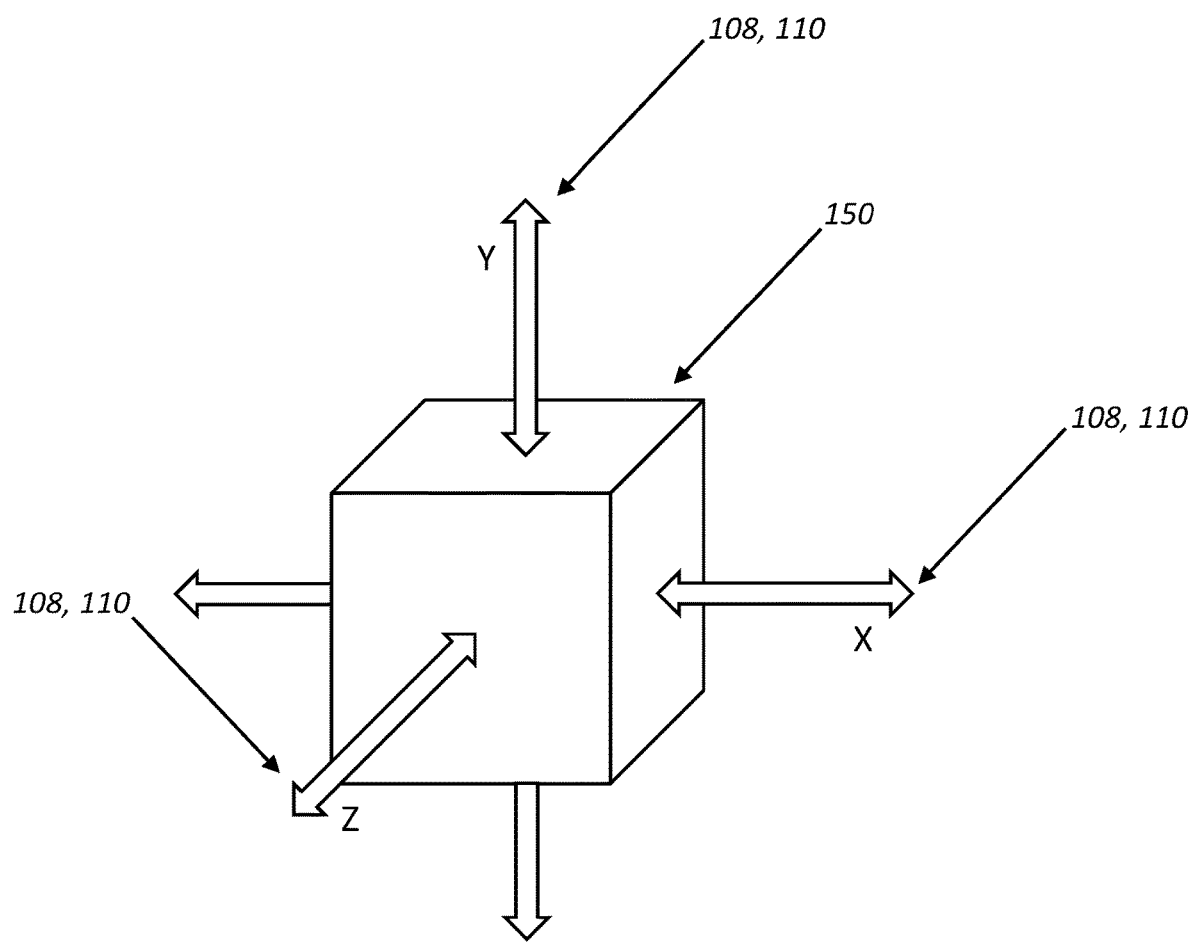
FIG. 2 is a schematic diagram illustrating the general principle of operation of one embodiment of the piezo-electric sensor assembly of the present disclosure, incorporating piezo-electric sensors operating in multiple (two or three) XYZ axes.

FIG. 2 is a schematic diagram illustrating the general principle of operation of one embodiment of the piezo-electric sensor assembly 150 of the present disclosure, incorporating piezo-electric sensors 100 (FIG. 1) operating in multiple (two or three) XYZ axes, nominally 90 degrees apart and orthogonal. Here, an individual sensor 100 is oriented to provide force/frequency measurements along each of any or all of the X-axis, the Y-axis, and the Z-axis. Alternatively, a piezo-electric material 102 (FIG. 1) can be used, along with appropriate electrical contacts 104 (FIG. 1), that is configured to simultaneously provide force/frequency measurements along any or all of the X-axis, the Y-axis, and the Z-axis. Thus, energy information is provided about the ultrasonic environment based on the relative motion of fluid against the assembly 150. In other words, information is provided about the relative strength of the motion. This enables on to gather information about the frequency dependence of standing waves and the ultrasonic behavior in a vessel or environment.

This approach provides data in three orthogonal planes and allows one to use the output signal to control transducer frequency and output to control standing wave behavior and relative cavitation behavior and bubble collapse. The approach can act as a feedback mechanism to ensure that a signal is not overdriven to a point that will damage components during ultrasonic cleaning, for example. The approach can act as a feedback mechanism to ensure that cavitation is sufficient to ensure complete cleaning of components. Data is logged and collected that can control tank energy, prevent component damage, ensure effective component cleaning, provide reproducibility, and ensure that a cleaning process can be kept within statistical control boundaries, for example.

Referring to FIGS. 1 and 2, the piezo-electric material 102 can be made up of multiple elements that are cut from the same crystal, for example, to provide signals in the longitudinal, transverse, and shear directions. By looking at these signals and the relative strengths, frequencies, and intensities in all directions, one can sweep the frequency in the vessel, and use the signal to tune the response for the energy and intensity that are most effective in a given application. In addition, this information can be used to characterize the vessel with minimal perturbation of the energy, and thus create a more homogenous or intense field in the vessel, depending on the application.

Figure 3:
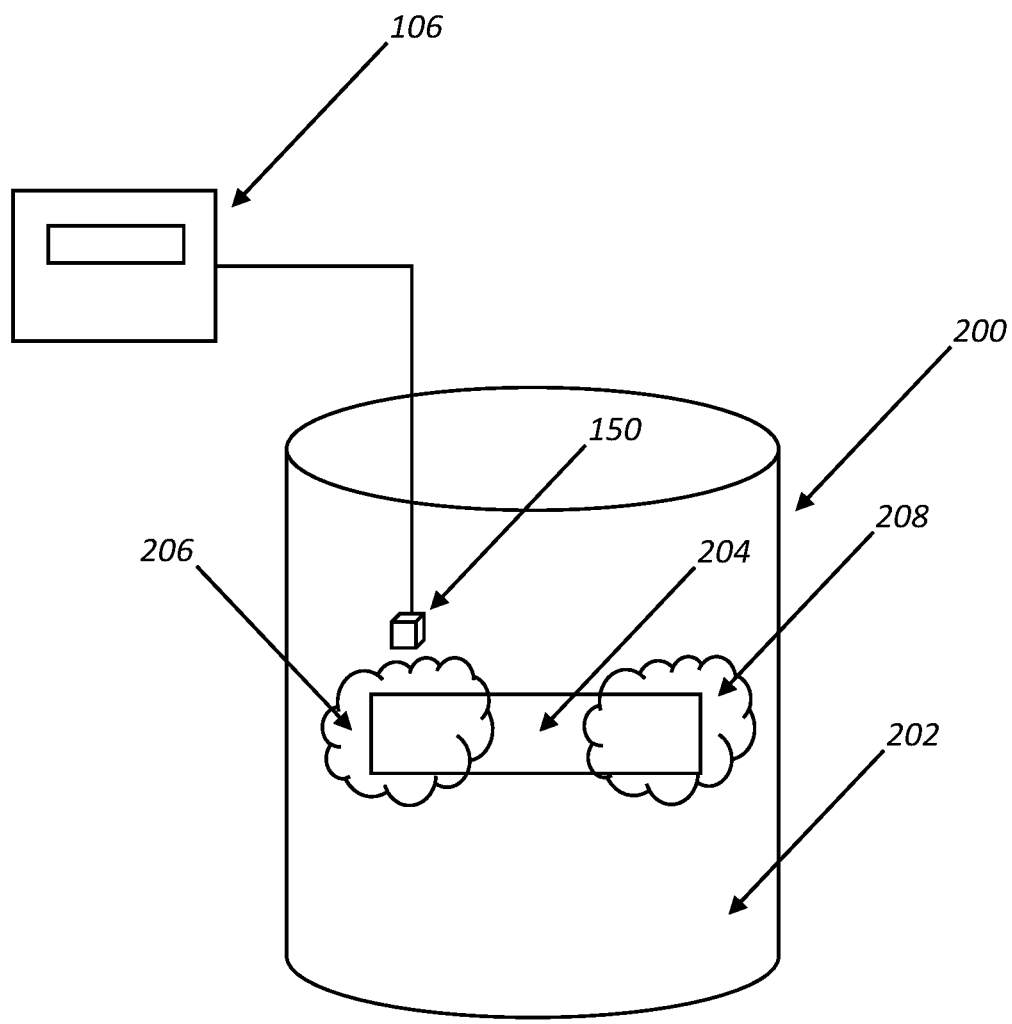
FIG. 3 is a schematic diagram illustrating the general principle of operation of one embodiment of the ultrasonic cleaning environment characterization method of the present disclosure.

FIG. 3 is a schematic diagram illustrating the general principle of operation of one embodiment of the ultrasonic cleaning environment characterization method of the present disclosure, utilizing a vessel or tank 200 in which a fluid 202 and component 204 to be cleaned are disposed. Using the piezo-electric sensor assembly 150 of the present disclosure and a coupled monitoring/control system 106, it can be determined that a first zone 206 within the fluid 202 provides a more intense cleaning environment based on wave intensity, frequency, amplification, and cavitation that is suitable for a more robust portion of the component 204, while a second zone 208 within the fluid 202 provides a more gentle cleaning environment based on wave intensity, frequency, amplification, and cavitation that is suitable for a more sensitive portion of the component 204.

If a part needs to be cleaned thoroughly all over, a strong, homogenous field below the damage threshold energy of the material being cleaning can be created. Given a part with sensitive and hardened areas, one could also create an energy profile which would clean the hardened portions without damaging the sensitive portions of the object being cleaned. A transverse, longitudinal, and shear signal (in at least 1 direction) can be gathered simultaneously and the signals can be used to provide a feedback mechanism to help tune frequency and intensity within the system. The data in all directions can be mapped at the same time for a given input frequency and strength. A network of sensors can be employed to map a vessel or a single sensor could be positioned in a series of locations to provide a complete energy distribution as a function of frequency. This provides directional response to, in this case, ultrasonic oscillations. The response gives information about the direction, frequency and intensity of the stimulus in multiple directions. By placing the probe of the present disclosure into an ultrasonic tank, and sweeping the frequency, one can find the frequency and position that is most effective in inducing ultrasonic impact. An array of such sensors could characterize the tank and return information on the frequency response, and the effect of wave reinforcement and cancellation. If this response is linked to a signal processor, the information can be used to provide active tuning to shape the ultrasonic wave characteristics to a desired impulse response. This can be used to achieve more intensive cleaning, clean more robust parts of an assembly with more impulse force than more delicate co-located components, or have a cleaning cycle based on deposited energy, as opposed to time, frequency, or intensity cycles.

Figure 4:
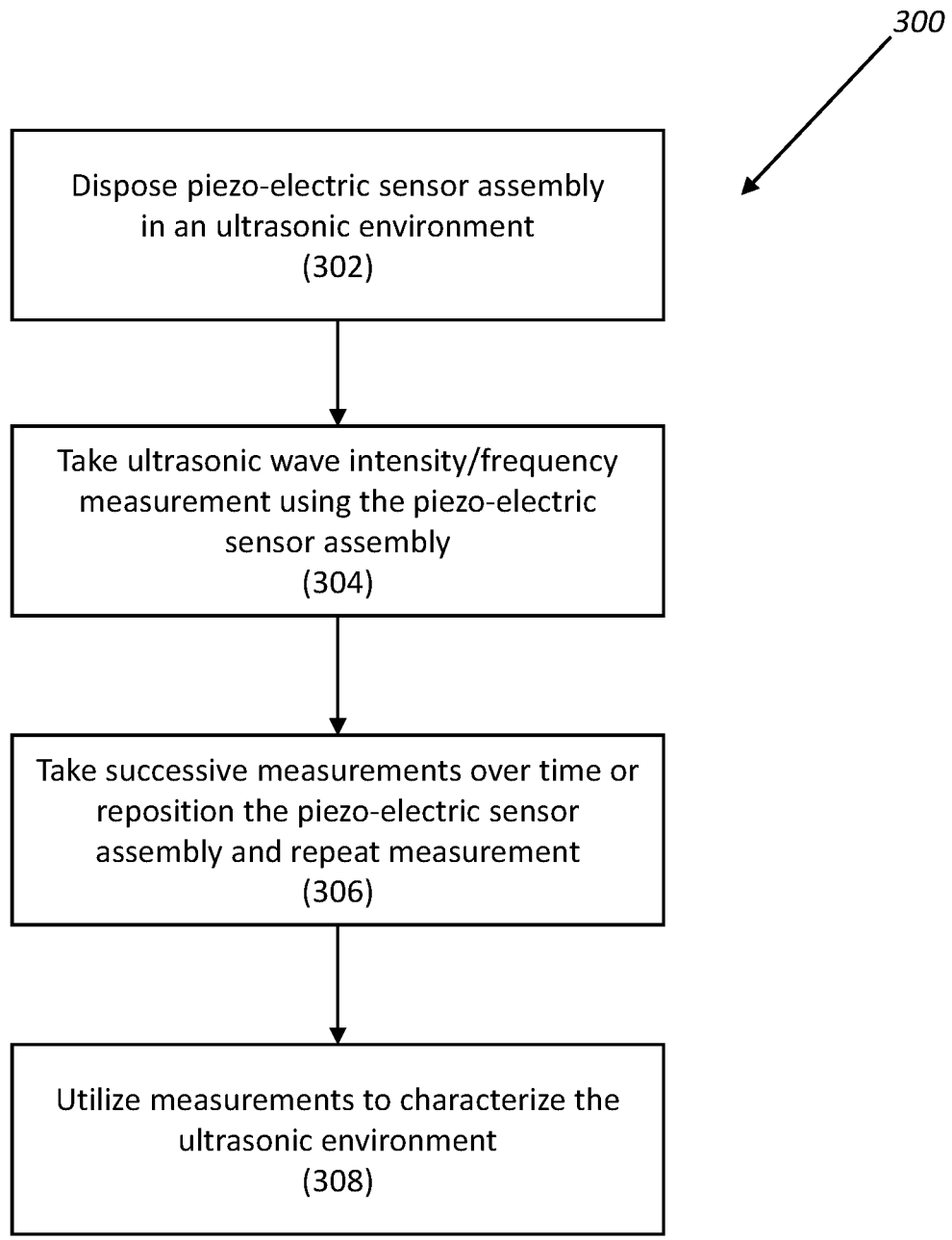
FIG. 4 is a flowchart illustrating one embodiment of the ultrasonic environment characterization method of the present disclosure.

FIG. 4 is a flowchart illustrating one embodiment of the ultrasonic environment characterization method 300 of the present disclosure. The method includes, after providing the piezo-electric sensor 100 (FIG. 1) or sensor assembly 150 (FIG. 2) described in detail above, such that measurements can be made in one or more directions along one or more axes, first disposing the piezo-electric sensor assembly 150 in an ultrasonic environment, such as that present in the fluid 202 (FIG. 3) in an ultrasonic cleaning vessel 200 (FIG. 3) or the like (step 302). Next, an ultrasonic wave intensity/frequency measurement is taken using the piezo-electric sensor assembly 150 (step 304). Subsequently, successive measurements are taken over time or the piezo-electric sensor assembly 150 is repositioned and measurement is repeated (step 306). Finally, the measurements taken are utilized to characterize the ultrasonic environment (step 308).

Figure 5:
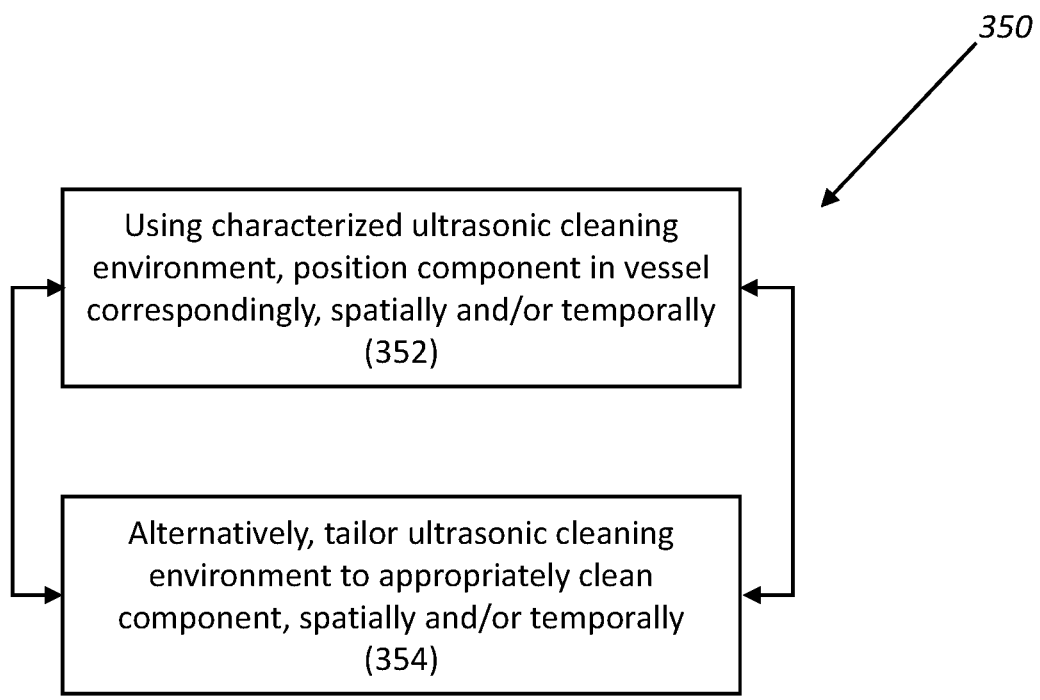
FIG. 5 is a flowchart illustrating one embodiment of the ultrasonic cleaning environment customization method of the present disclosure.

FIG. 5 is a flowchart illustrating one embodiment of the ultrasonic cleaning environment customization method 350 of the present disclosure. The method 350 includes, using characterized ultrasonic cleaning environment, positioning a component 204 (FIG. 3) in a vessel 200 (FIG. 3) correspondingly, spatially and/or temporally, given the high and low intensity ultrasonic wave areas identified within the vessel 200 (step 352). Alternatively, the method 350 includes tailoring the ultrasonic cleaning environment to appropriately clean a component 204, spatially and/or temporally, by manipulating the high and low intensity ultrasonic wave areas identified within the vessel 200 (step 354).

Figure 6:
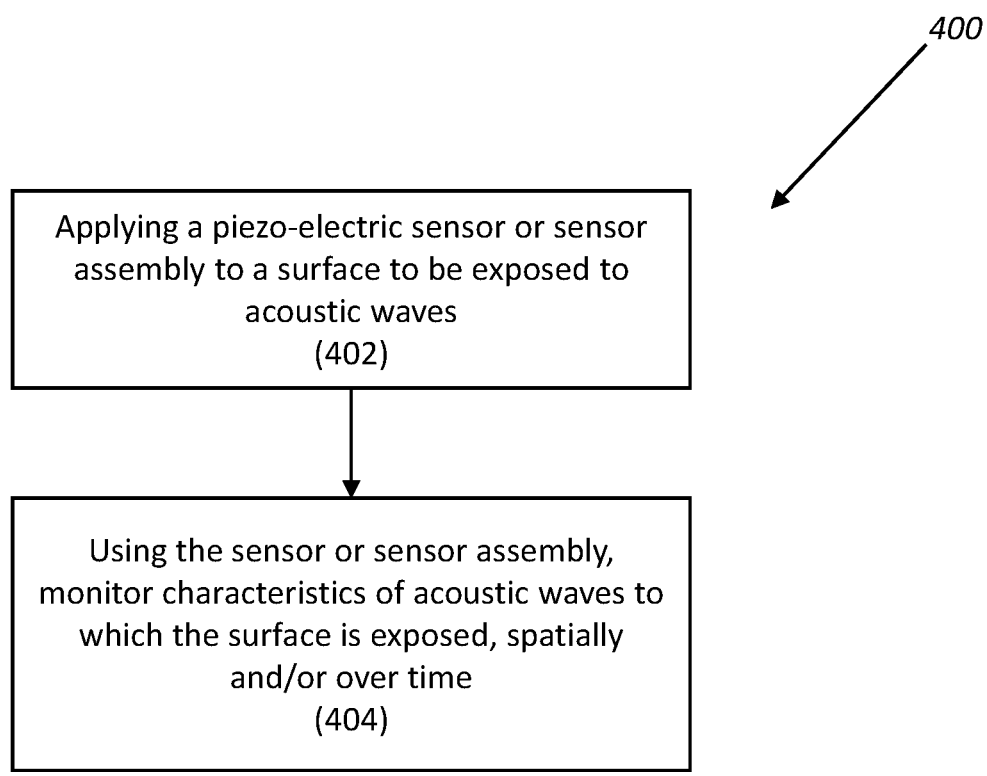
FIG. 6 is a flowchart illustrating one embodiment of the ultrasonic environment monitoring method of the present disclosure.

FIG. 6 is a flowchart illustrating one embodiment of the ultrasonic environment monitoring method 400 of the present disclosure. The method 400 includes applying a piezo-electric sensor 100 (FIG. 1) or sensor assembly 200 (FIG. 2) to a surface to be exposed to acoustic waves (step 402). The method 400 further includes using the sensor 100 or sensor assembly 200, monitoring characteristics of the acoustic waves to which the surface is exposed, spatially and/or over time (step 404).

It is to be recognized that, depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

Figure 7:
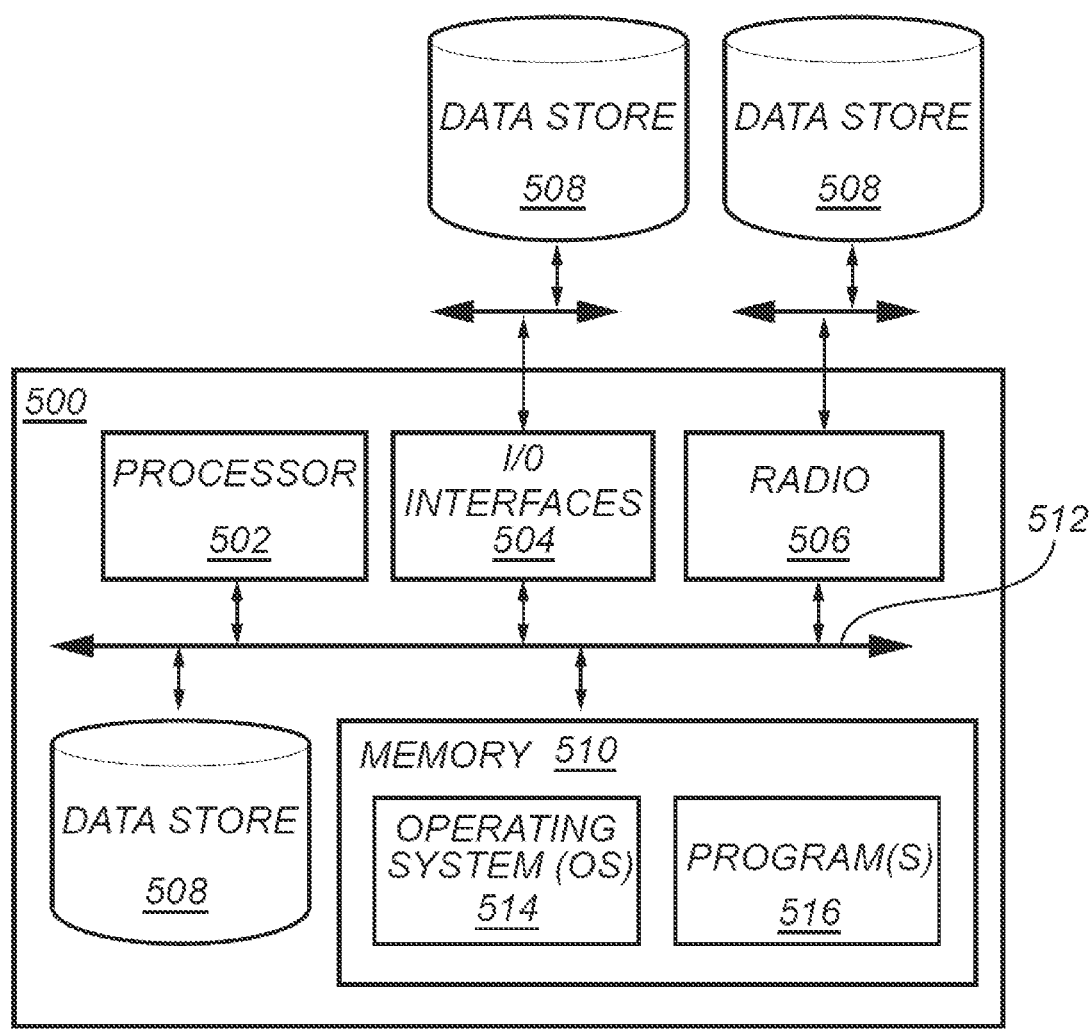
FIG. 7 is a schematic diagram of a server or other processing system that may be used in a cloud-based computational system or stand-alone, as appropriate, for operating the assemblies and implementing the methods of the present disclosure.

FIG. 7 is a schematic diagram of a server or other processing system 500, which may be used in a cloud-based computational system, in another system, or stand-alone, as appropriate, for operating the assemblies and implementing the methods of the present disclosure. The server 500 may be a digital computer that, in terms of hardware architecture, generally includes a processor 502, input/output (I/O) interfaces 504, a network interface 506, a data store 508, and memory 510. It should be appreciated by those of ordinary skill in the art that FIG. 7 depicts the server 500 in an oversimplified manner, and a practical embodiment may include additional components and suitably configured processing logic to support known or conventional operating features that are not described in detail herein. The components (502, 504, 506, 508, and 510) are communicatively coupled via a local interface 512. The local interface 512 may be, for example, but is not limited to, one or more buses or other wired or wireless connections, as is known in the art. The local interface 512 may have additional elements, which are omitted for simplicity, such as controllers, buffers (caches), drivers, repeaters, and receivers, among many others, to enable communications. Further, the local interface 512 may include address, control, and/or data connections to enable appropriate communications among the aforementioned components.

The processor 502 is a hardware device for executing software instructions. The processor 502 may be any custom made or commercially available processor, a central processing unit (CPU), an auxiliary processor among several processors associated with the server 500, a semiconductor-based microprocessor (in the form of a microchip or chipset), or generally any device for executing software instructions. When the server 500 is in operation, the processor 502 is configured to execute software stored within the memory 510, to communicate data to and from the memory 510, and to generally control operations of the server 500 pursuant to the software instructions. The I/O interfaces 504 may be used to receive user input from and/or for providing system output to one or more devices or components.

The network interface 506 may be used to enable the server 500 to communicate on a network, such as the Internet. The network interface 506 may include, for example, an Ethernet card or adapter (e.g., 10BaseT, Fast Ethernet, Gigabit Ethernet, or 10 GbE) or a Wireless Local Area Network (WLAN) card or adapter (e.g., 802.11a/b/g/n/ac). The network interface 506 may include address, control, and/or data connections to enable appropriate communications on the network. A data store 508 may be used to store data. The data store 508 may include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 508 may incorporate electronic, magnetic, optical, and/or other types of storage media. In one example, the data store 508 may be located internal to the server 500, such as, for example, an internal hard drive connected to the local interface 512 in the server 500. Additionally, in another embodiment, the data store 508 may be located external to the server 500 such as, for example, an external hard drive connected to the I/O interfaces 504 (e.g., a SCSI or USB connection). In a further embodiment, the data store 508 may be connected to the server 500 through a network, such as, for example, a network-attached file server.

The memory 510 may include any of volatile memory elements (e.g., random access memory (RAM, such as DRAM, SRAM, SDRAM, etc.)), nonvolatile memory elements (e.g., ROM, hard drive, tape, CDROM, etc.), and combinations thereof. Moreover, the memory 510 may incorporate electronic, magnetic, optical, and/or other types of storage media. Note that the memory 510 may have a distributed architecture, where various components are situated remotely from one another but can be accessed by the processor 502. The software in memory 510 may include one or more software programs, each of which includes an ordered listing of executable instructions for implementing logical functions. The software in the memory 510 includes a suitable operating system (O/S) 514 and one or more programs 516. The operating system 514 essentially controls the execution of other computer programs, such as the one or more programs 516, and provides scheduling, input-output control, file and data management, memory management, and communication control and related services. The one or more programs 516 may be configured to implement the various processes, algorithms, methods, techniques, etc. described herein.

It will be appreciated that some embodiments described herein may include one or more generic or specialized processors ("one or more processors") such as microprocessors; central processing units (CPUs); digital signal processors (DSPs); customized processors such as network processors (NPs) or network processing units (NPUs), graphics processing units (GPUs), or the like; field programmable gate arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more application-specific integrated circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer-readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a Read-Only Memory (ROM), a Programmable Read-Only Memory (PROM), an Erasable Programmable Read-Only Memory (EPROM), an Electrically Erasable Programmable Read-Only Memory (EEPROM), flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Figure 8:
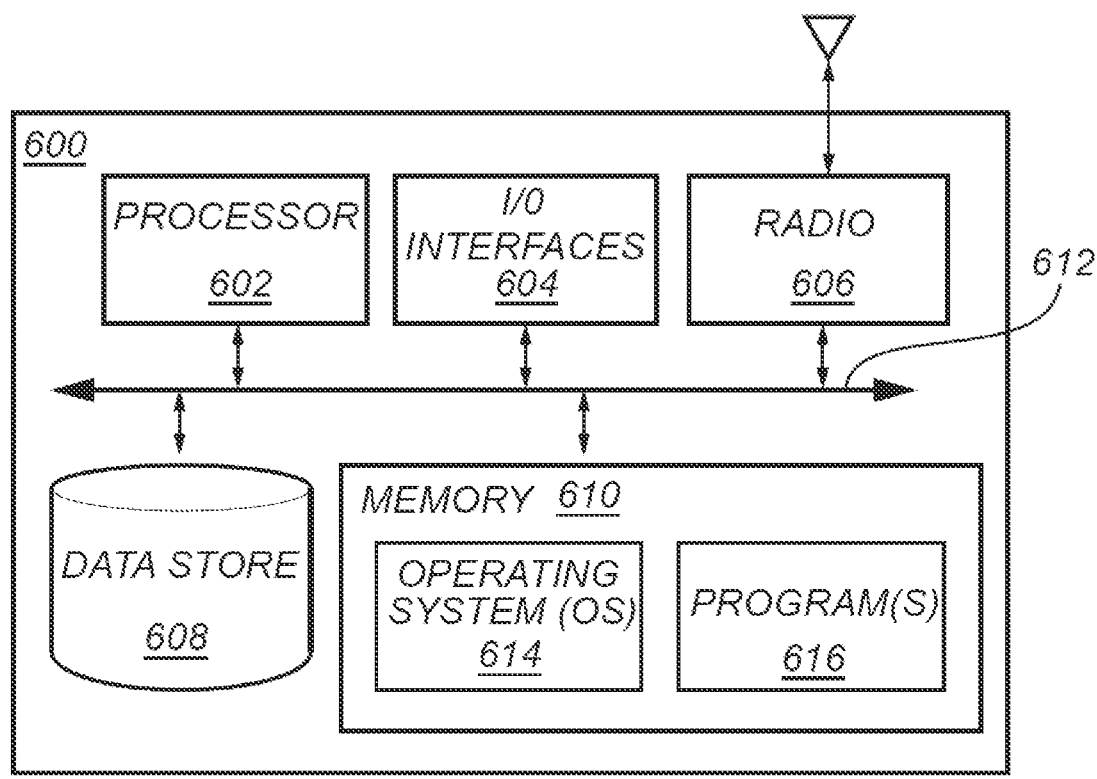
FIG. 8 is a schematic diagram of a mobile or accessory device that may be used in a cloud-based computational system or stand-alone, as appropriate, for operating the assemblies and implementing the methods of the present disclosure.

FIG. 8 is a block diagram of a mobile or accessory device 600 that may be used in a cloud-based computational system, in another system, or stand-alone, as appropriate, for operating the assemblies and implementing the methods of the present disclosure. The device 600 can be a smartphone, a tablet, a smartwatch, an Internet of Things (IoT) device, a laptop, a virtual reality (VR) headset, apiece of equipment, etc. The device 600 can be a digital device that, in terms of hardware architecture, generally includes a processor 602, I/O interfaces 604, a radio 606, a data store 608, and memory 610. It should be appreciated by those of ordinary skill in the art that FIG. 8 depicts the device 600 in an oversimplified manner, and a practical embodiment may include additional components and suitably configured processing logic to support known or conventional operating features that are not described in detail herein. The components (602, 604, 606, 608, and 610) are communicatively coupled via a local interface 612. The local interface 612 can be, for example, but is not limited to, one or more buses or other wired or wireless connections, as is known in the art. The local interface 612 can have additional elements, which are omitted for simplicity, such as controllers, buffers (caches), drivers, repeaters, and receivers, among many others, to enable communications. Further, the local interface 612 may include address, control, and/or data connections to enable appropriate communications among the aforementioned components.

The processor 602 is a hardware device for executing software instructions. The processor 602 can be any custom made or commercially available processor, a CPU, an auxiliary processor among several processors associated with the device 600, a semiconductor-based microprocessor (in the form of a microchip or chipset), or generally any device for executing software instructions. When the device 600 is in operation, the processor 602 is configured to execute software stored within the memory 610, to communicate data to and from the memory 610, and to generally control operations of the device 600 pursuant to the software instructions. In an embodiment, the processor 602 may include a mobile optimized processor such as optimized for power consumption and mobile applications. The I/O interfaces 604 can be used to receive user input from and/or for providing system output. User input can be provided via, for example, a keypad, a touch screen, a scroll ball, a scroll bar, buttons, a barcode scanner, and the like. System output can be provided via a display device such as a liquid crystal display (LCD), touch screen, and the like.

The radio 606 enables wireless communication to an external access device or network. Any number of suitable wireless data communication protocols, techniques, or methodologies can be supported by the radio 606, including any protocols for wireless communication. The data store 608 may be used to store data. The data store 608 may include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 608 may incorporate electronic, magnetic, optical, and/or other types of storage media.

Again, the memory 610 may include any of volatile memory elements (e.g., random access memory (RAM, such as DRAM, SRAM, SDRAM, etc.)), nonvolatile memory elements (e.g., ROM, hard drive, etc.), and combinations thereof. Moreover, the memory 610 may incorporate electronic, magnetic, optical, and/or other types of storage media. Note that the memory 610 may have a distributed architecture, where various components are situated remotely from one another, but can be accessed by the processor 602. The software in memory 610 can include one or more software programs, each of which includes an ordered listing of executable instructions for implementing logical functions. In the example of FIG. 8, the software in the memory 610 includes a suitable operating system 614 and programs 616. The operating system 614 essentially controls the execution of other computer programs and provides scheduling, input-output control, file and data management, memory management, and communication control and related services. The programs 616 may include various applications, add-ons, etc. configured to provide end user functionality with the device 600. For example, example programs 616 may include, but not limited to, a web browser, social networking applications, streaming media applications, games, mapping and location applications, electronic mail applications, financial applications, and the like. In a typical example, the end-user typically uses one or more of the programs 616 along with a network, such as a cloud-based system.

Although the present disclosure is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A piezo-electric sensor system adapted to monitor/characterize an ultrasonic environment, the piezo-electric sensor system comprising:
    a first piezo-electric material body disposed within a vessel in a fluid of the ultrasonic environment and adapted to generate an output voltage responsive to force applied by an ultrasonic wave in the ultrasonic environment in one or more directions along a first axis;
    a second piezo-electric material body disposed within the vessel in the fluid of the ultrasonic environment and adapted to generate an output voltage responsive to force applied by an ultrasonic wave in the ultrasonic environment in one or more directions along a second axis orthogonal to the first axis;
    a third piezo-electric material body disposed within the vessel in the fluid of the ultrasonic environment and adapted to generate an output voltage responsive to force applied by an ultrasonic wave in the ultrasonic environment in one or more directions along a third axis orthogonal to the first axis and the second axis;
    one or more electrical contacts electrically coupled to the first piezo-electric material; and
    a control system electrically coupled to the one or more electrical contacts and operable for monitoring/characterizing the ultrasonic environment based on the output voltage.

2. The piezo-electric sensor system of claim 1, wherein the first piezo-electric material body, the second piezo-electric material body, and the third piezo-electric material body are a same piezo-electric material body adapted to generate output voltages responsive to forces applied by ultrasonic waves in the ultrasonic environment in any of the one or more directions along any of the first axis, the second axis, and the third axis.

3. An ultrasonic system, comprising:
    a piezo-electric sensor assembly comprising a piezo-electric material body disposed within a vessel in a fluid of an ultrasonic environment and adapted to measure ultrasonic waves in the ultrasonic environment;
    wherein the piezo-electric material body comprises a first piezo-electric material body adapted to generate an output voltage responsive to force applied by an ultrasonic wave in the ultrasonic environment in one or more directions along a first axis;
    wherein the piezo-electric material body further comprises a second piezo-electric material body adapted to generate an output voltage responsive to force applied by an ultrasonic wave in the ultrasonic environment in one or more directions along a second axis orthogonal to the first axis; and
    wherein the piezo-electric material body further comprises a third piezo-electric material body adapted to generate an output voltage responsive to force applied by an ultrasonic wave in the ultrasonic environment in one or more directions along a third axis orthogonal to the first axis and the second axis;
    an ultrasonic transducer adapted to generate the ultrasonic waves in the ultrasonic environment; and
    a control system electrically coupled to the piezo-electric sensor assembly and the ultrasonic transducer and operable for monitoring/characterizing the ultrasonic environment based on an output from the piezo-electric sensor assembly and selectively modifying operation of the ultrasonic transducer.

4. The ultrasonic system of claim 3, wherein the first piezo-electric material body, the second piezo-electric material body, and the third piezo-electric material body are a same piezo-electric material body adapted to generate output voltages responsive to forces applied by ultrasonic waves in the ultrasonic environment in any of the one or more directions along any of the first axis, the second axis, and the third axis.

5. An ultrasonic method, comprising:
positioning a piezo-electric sensor assembly adapted to sense ultrasonic waves at a first position in an ultrasonic environment with a piezo-electric material body of the piezo-electric sensor assembly disposed within a vessel in a fluid of the ultrasonic environment;
wherein the piezo-electric material body comprises a first piezo-electric material body adapted to generate an output voltage responsive to force applied by an ultrasonic wave in the ultrasonic environment in one or more directions along a first axis;
wherein the piezo-electric material body further comprises a second piezo-electric material body adapted to generate an output voltage responsive to force applied by an ultrasonic wave in the ultrasonic environment in one or more directions along a second axis orthogonal to the first axis; and
wherein the piezo-electric material body further comprises a third piezo-electric material body adapted to generate an output voltage responsive to force applied by an ultrasonic wave in the ultrasonic environment in one or more directions along a third axis orthogonal to the first axis and the second axis; and
monitoring/characterizing the ultrasonic waves at the first position in the ultrasonic environment based on a first output from the piezo-electric sensor assembly.

6. The ultrasonic method of claim 5, further comprising modifying operation of an ultrasonic transducer used to generate the ultrasonic waves in the ultrasonic environment based on the first output from the piezo-electric sensor assembly.

7. The ultrasonic method of claim 5, further comprising:
repositioning the piezo-electric sensor assembly adapted to sense ultrasonic waves at a second position in the ultrasonic environment with the piezo-electric material body of the piezo-electric sensor assembly disposed within the vessel in the fluid of the ultrasonic environment; and
monitoring/characterizing the ultrasonic waves at the second position in the ultrasonic environment based on a second output from the piezo-electric sensor assembly.

8. The ultrasonic method of claim 7, further comprising modifying operation of an ultrasonic transducer used to generate the ultrasonic waves in the ultrasonic environment based on the second output from the piezo-electric sensor assembly.

9. The ultrasonic method of claim 5, wherein the first piezo-electric material body, the second piezo-electric material body, and the third piezo-electric material body are a same piezo-electric material body adapted to generate output voltages responsive to forces applied by ultrasonic waves in the ultrasonic environment in any of the one or more directions along any of the first axis, the second axis, and the third axis.

* * * * *